(12) United States Patent
Li et al.

(10) Patent No.: US 10,916,565 B2
(45) Date of Patent: Feb. 9, 2021

(54) LTPS SUBSTRATE AND FABRICATING METHOD THEREOF, THIN FILM TRANSISTOR THEREOF, ARRAY SUBSTRATE THEREOF AND DISPLAY DEVICE THEREOF

(71) Applicant: BOE TECHNOLOGY GROUP CO., LTD., Beijing (CN)

(72) Inventors: Haixu Li, Beijing (CN); Zhanfeng Cao, Beijing (CN); Qi Yao, Beijing (CN); Dapeng Xue, Beijing (CN); Da Lu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/330,922

(22) PCT Filed: May 15, 2018

(86) PCT No.: PCT/CN2018/086809
§ 371 (c)(1),
(2) Date: Mar. 6, 2019

(87) PCT Pub. No.: WO2018/233403
PCT Pub. Date: Dec. 27, 2018

(65) Prior Publication Data
US 2019/0237488 A1   Aug. 1, 2019

(30) Foreign Application Priority Data

Jun. 22, 2017 (CN) .......................... 2017 1 0482644

(51) Int. Cl.
*H01L 21/00* (2006.01)
*H01L 27/12* (2006.01)
(Continued)

(52) U.S. Cl.
CPC ...... *H01L 27/1218* (2013.01); *H01L 29/6675* (2013.01); *H01L 29/78633* (2013.01); *H01L 29/78672* (2013.01); *H01L 29/78675* (2013.01)

(58) Field of Classification Search
CPC ............. H01L 27/1218; H01L 29/6675; H01L 29/78633; H01L 29/78672; H01L 29/78675
(Continued)

(56) References Cited

U.S. PATENT DOCUMENTS

| 4,609,930 A | 9/1986 | Yamazaki |
| 5,291,572 A * | 3/1994 | Blonder ............... G02B 6/4202 257/E23.193 |

(Continued)

FOREIGN PATENT DOCUMENTS

| CN | 104022123 A | 9/2014 |
| CN | 107316906 A | 11/2017 |
| JP | 59204274 A | 11/1984 |

OTHER PUBLICATIONS

PCT International Search Report, Application No. PCT/CN2018/086809, dated Aug. 9, 2018, 5 pages: with English translation.
(Continued)

*Primary Examiner* — Laura M Menz
(74) *Attorney, Agent, or Firm* — Armstrong Teasdale LLP

(57) ABSTRACT

The present disclosure provides a field of display technologies, and in particular, to a LTPS substrate and a fabricating method thereof, a thin film transistor thereof, an array substrate thereof, and a display device thereof. The LTPS substrate, able to be used for the fabrication of a thin film transistor, includes a light shielding layer, the light shielding layer mainly composed of amorphous silicon doped with a lanthanide element. The present disclosure mainly employs an amorphous silicon film layer doped with the lanthanide
(Continued)

element as the light shielding layer of the LTPS substrate, which not only ensures the light shielding efficiency but also reduces the production process, and further prevents the occurrence of the H explosion problem due to H exuding during the ELA process.

16 Claims, 1 Drawing Sheet

(51) Int. Cl.
    *H01L 29/786*     (2006.01)
    *H01L 29/66*     (2006.01)

(58) Field of Classification Search
    USPC .................................. 438/149, 182; 257/72
    See application file for complete search history.

(56) References Cited

U.S. PATENT DOCUMENTS

| | | | | |
|---|---|---|---|---|
| 6,448,109 B1* | 9/2002 | Karpman | ............. | B81B 7/0077 156/182 |
| 6,777,263 B1* | 8/2004 | Gan | .................... | B81C 1/00269 257/417 |
| 10,600,704 B2* | 3/2020 | Lopez | ............... | H01L 23/49838 |
| 2009/0160751 A1* | 6/2009 | Collins | ............. | G02F 1/136213 345/98 |
| 2015/0333115 A1* | 11/2015 | Yang | ....................... | H01L 27/12 257/40 |
| 2017/0301705 A1* | 10/2017 | Hu | .......................... | H01L 51/52 |
| 2019/0051671 A1* | 2/2019 | Ban | .................... | H01L 31/02164 |
| 2019/0237488 A1* | 8/2019 | Li | ....................... | H01L 29/6675 |
| 2019/0279926 A1* | 9/2019 | Hsieh | ................ | H01L 23/49838 |
| 2020/0185288 A1* | 6/2020 | Lopez | ............... | H01L 23/49838 |

OTHER PUBLICATIONS

PCT Written Opinion, Application No. PCT/CN2018/086809, dated Aug. 9, 2018, 6 pages.: with English translation of relevant part.
China First Office Action, Application No. 201710482644.2, dated May 8, 2019, 13 pages.: with English translation.
Cheng Xingkui et al., "Investigation on the Properties of a-Si : H Material Doped with Rare Earth Element", Journal of Inorganic Materials, vol. 3, No. 4, Dec. 1988, 12 pages: with English translation.

* cited by examiner

LTPS SUBSTRATE AND FABRICATING METHOD THEREOF, THIN FILM TRANSISTOR THEREOF, ARRAY SUBSTRATE THEREOF AND DISPLAY DEVICE THEREOF

CROSS REFERENCE TO RELATED APPLICATIONS

This patent application is a National Stage Entry of PCT/CN2018/086809 filed on May 15, 2018, which claims the benefit and priority of Chinese Patent Application No. 201710482644.2 filed on Jun. 22, 2017, the disclosures of which are incorporated by reference herein in their entirety as part of the present application.

BACKGROUND

The present disclosure relates to a field of display technologies, and in particular, to a LTPS substrate and a fabricating method thereof, a thin film transistor thereof, an array substrate thereof, and a display device thereof.

Due to the high ion mobility of low temperature polysilicon (LTPS), it can be used to fabricate display panels with high resolution and high aperture ratio. With the development of technology, LTPS has gradually become a material essential for deposition of active layers of thin film transistors in mainstream displays during the fabricating process of liquid crystal display devices. In the prior art, when the active layer is formed by depositing polysilicon, a light shielding layer is needed at the bottom of the active layer. The light shielding layer material is usually an opaque metal material. Since the light shielding layer is formed by employing a metal material, there is a need to add a process to form a mask in a subsequent step, thus the addition of this process inevitably leads to an increase in production costs.

BRIEF DESCRIPTION

The present disclosure provides a LTPS substrate, a fabricating method thereof, a thin film transistor thereof, an array substrate thereof, and a display device thereof. The LTPS substrate is formed by employing amorphous silicon doped with a lanthanide element to form a light shielding layer, which achieves the light shielding requirement of the LTPS, reduces the processing process, and reduces the production cost.

The present disclosure provides a LTPS substrate, able to be used for fabricating a thin film transistor, including a light shielding layer, the light shielding layer mainly composed of amorphous silicon doped with a lanthanide element.

Further, the lanthanide element doped in the amorphous silicon is lanthanum or cerium.

Specifically, a content of cerium in the light shielding layer is about 0.2-2.0% wt.

Further, the LTPS substrate further includes a first buffer layer disposed below the light shielding layer, a second buffer layer disposed above the light shielding layer, and a polysilicon layer disposed above the second buffer layer.

Furthermore, deposition material of the first buffer layer and the second buffer layer includes at least one of silicon oxide and silicon nitride, and the polysilicon layer includes a polysilicon film layer formed by crystallizing an amorphous silicon film layer as deposited.

The present disclosure also provides a fabricating method of a LTPS substrate. The LTPS substrate includes a base substrate and a first buffer layer, a light shielding layer, a second buffer layer, and a polysilicon layer deposited on the base substrate and sequentially stacked. The fabricating method includes performing a lanthanide element doping treatment on the light shielding layer after the polysilicon layer is deposited to form a film layer.

Further, a specific process of performing the lanthanide element doping treatment on the light shielding layer includes employing ion implantation where kinetic energy of the lanthanide element ion is controlled such that the lanthanide element ion enters a position where the light shielding layer is located and does not stay at a position where the polysilicon layer is located, and a manner of controlling the kinetic energy of the lanthanide element ion mainly includes a voltage being controlled to about 10-15 Kev, and an electron beam current being controlled to about 0.9-1.3 µA/cm.

Furthermore, before performing the lanthanide element doping treatment on the light shielding layer, the fabricating method further including following steps of dehydrogenating, and placing the LTPS substrate at an environment of a temperature of about 450-490° C. to be subjected to an air treatment for about 30-60 min.

The present disclosure also provides a thin film transistor which is fabricated on the basis of the LTPS substrate described in any of the above technical solutions.

The present disclosure also provides an array substrate including the thin film transistor of any of the above technical solutions.

The present disclosure also provides a display device including the array substrate of any of the above technical solutions.

Compared with the prior art, the present disclosure has the following advantages.

The LTPS substrate provided by the present disclosure includes a light shielding layer formed of amorphous silicon doped with a lanthanide element. The lanthanide element is used as an impurity in the material of the light shielding layer. Since the lanthanide element has a strong hydrogen (H) bonding capacity, it can react rapidly with H, and it can be rapidly bonded with H to form dihydride or trihydride before it overflows from the amorphous silicon. This kind of hydride starts to decompose under certain conditions. Thus, doping the amorphous silicon with the lanthanide element can effectively fix the residual H after dehydrogenation process to the amorphous silicon, and prevent the occurrence of the H explosion problem due to H exuding during the excimer laser annealing (ELA) process. In addition, during the ELA process, there is no influence on the amorphous silicon doped with the lanthanide element. That is because there is a buffer layer above the amorphous silicon doped with the lanthanide element. Moreover, by adjusting the ELA energy parameter, it is possible to achieve an effect of not affecting the amorphous silicon layer doped with the lanthanide element. At the same time, since the light shielding layer formed by using amorphous silicon doped with the lanthanide element achieves the requirement of light shielding efficiency of LTPS, the processing steps of the LTPS substrate is reduced, and the production cost is reduced.

Further, in some embodiments of the present disclosure, cerium element of the lanthanide elements is used as the doping element of the amorphous silicon layer. Since the hydride formed by cerium and H needs to be heated to 1000° C. to start decomposing, which further increases the stability of the light shielding layer during the ELA process.

Further, in the fabricating method of the LTPS substrate provided by the present disclosure, the fabricating method mainly includes performing a lanthanide element doping treatment on the light shielding layer after depositing the polysilicon layer to form a film layer. Specifically, by controlling the kinetic energy of the lanthanide element ion, the light shielding layer is doped with the lanthanide element, and the H present in the light shielding layer is effectively fixed. The method ensures that the lanthanide element ion do not stay at a position where the polysilicon layer is located during the doping process and thus ensuring the performing of subsequent process.

Meanwhile, the thin film transistor provided by the present disclosure is fabricated on the basis of the LTPS substrate described above, and therefore, the thin film transistor naturally inherits all the advantages of the LTPS substrate.

On the other hand, the array substrate provided by the present disclosure is formed by using the above-described thin film transistor, and therefore, the array naturally inherits all the advantages of the thin film transistor.

Accordingly, the display device provided by the present disclosure is fabricated using the above array substrate.

In summary, the present disclosure not only ensures the light shielding efficiency but also reduces the production process, and further prevents the occurrence of the H explosion problem due to H exuding during the ELA process. Thus, the problem of ELA defects existing during the fabricating process of the LTPS substrate is solved, and in addition, the complexity of the overall fabrication of the corresponding device or system can be reduced to some extent and the cost can be effectively saved.

DETAILED DESCRIPTION

Figure 1:
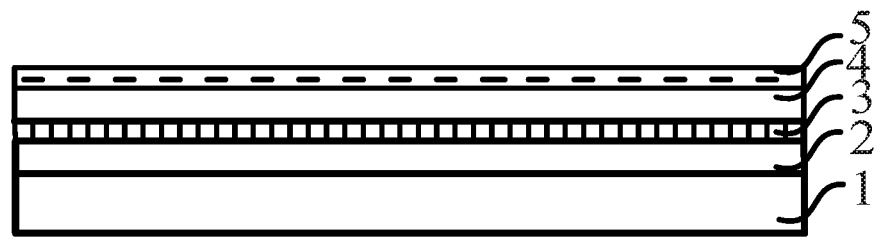
FIG. 1 is a schematic structural view of an embodiment of a LTPS substrate according to the present disclosure, mainly showing a cross-sectional morphology formed after deposition of a LTPS substrate.

The disclosure is further described in the following with reference to the drawings and exemplary embodiments, wherein like reference numerals refer to the same parts throughout. Further, if a detailed description of a known technique is not necessary to show the features of the present disclosure, it will be omitted.

The low temperature polysilicon (LTPS) substrate provided by the embodiments of the present disclosure can be used for fabrication of a thin film transistor (TFT). The LTPS substrate employs a light shielding layer (LS) mainly composed of amorphous silicon (a-Si) doped with a lanthanide element as a light shielding layer at the bottom of the polysilicon (p-Si) layer, which simplifies the fabrication process and reduces production costs.

The technical solution of the present disclosure will be further described in detail below through the accompanying drawings and specific embodiments.

Embodiment One

As can be seen from FIG. 1, the LTPS substrate in the present embodiment has an independent light shielding layer 3. The light shielding layer 3 is selected to be formed using amorphous silicon doped with a lanthanide element. Wherein, the lanthanide element doped in the amorphous silicon is lantharum (La) or cerium (Ce). Specifically, when cerium is used as the doping element, a content of cerium in the light shielding layer 3 is about 0.2 to 2.0% wt. In this embodiment, since the amorphous silicon contains H and the LTPS substrate formed will undergo processes of dehydrogenation and ELA, in which the H contained in the amorphous cannot be completely removed during the dehydrogenation process such that, during the ELA process, the H exuding will be occurred in the light shielding layer 3 formed using amorphous silicon which will cause a phenomenon that the LTPS substrate has defects during the ELA process, a film layer formed of amorphous silicon doped with a lanthanide element is used as the light shielding layer 3. Thus, in the present embodiment, in order to solve the above problem, the film layer formed of amorphous silicon is doped with a lanthanide element and used as the light shielding layer 3. Among them, the lanthanide element is located in the subgroup of the group III of the periodic system. Since the stability of the hydride produced by cerium reacting with H is stronger than the stability of the hydride produced by lantharum reacting with H, in the present embodiment, it is optional to dope cerium in amorphous silicon (the following embodiments are described in the case where doping cerium in amorphous silicon is an example embodiment). Cerium is a rare earth element with an atomic number of 58 and a strong H bonding capacity. The rare earth cerium metal can rapidly react with hydrogen at about 150-300° C., and it has rapidly bonded with H to form a dihydride or a trihydride before it overflows in amorphous silicon. Moreover, the above hydride does not start to decompose only when heated above about 1000° C. Cerium enables the amorphous silicon film layer doped with cerium to effectively fix H in the film layer during the ELA process, and avoids the phenomenon of H exuding.

On the basis of the structure of the above light shielding layer 3 of the embodiment, the LTPS provided by the embodiments further includes a first buffer layer 2, a second buffer layer 4, and a polysilicon layer 5.

The first buffer layer 2 is disposed below the light shielding layer 3. Specifically, the first buffer layer 2 is a buffer layer deposited by plasma chemical vapor deposition (PECVD) on the substrate 1. The first buffer layer 2 as deposited is at least one of a single layer of silicon oxide ($SiO_x$) film layer, a single layer of silicon nitride ($SiN_x$) film layer, and a stacked film layer formed of silicon oxide and silicon nitride. A reaction gas forming the $SiO_x$ film layer may be a mixed gas of silane ($SiN_x$), ammonia ($NH_3$), and oxygen ($O_2$), or a mixed gas of silicon dichloride ($SiH_2Cl_2$), ammonia ($NH_3$), and oxygen ($O_2$). A reaction gas for forming the $SiN_x$ film layer may be a mixed gas of silane ($SiH_x$), ammonia ($NH_3$), and nitrogen ($N_2$), or a mixed gas of silicon dichloride ($SiH_2Cl_2$), ammonia ($NH_3$), and nitrogen ($N_2$). Wherein, the thickness of a deposited film layer is about 1000-3000 Å. The first buffer layer 2 may cover the entire base substrate 1.

The second buffer layer 4 is disposed above the light shielding layer 3. Specifically, the second buffer layer 4 is a buffer layer deposited by plasma chemical vapor deposition (PECVD) on the light shielding layer 3. The second buffer layer 4 as deposited is at least one of a single layer of silicon oxide ($SiO_x$) film layer, a single layer of silicon nitride ($SiN_x$) film layer, and a stacked film layer formed of silicon oxide and silicon nitride. A reaction gas forming the $SiO_x$ film layer may be a mixed gas of silane ($SiN_x$), ammonia (NH$_3$), and oxygen (O$_2$), or a mixed gas of silicon dichloride (SiH$_2$Cl$_2$), ammonia (NH$_3$), and oxygen (O$_2$). A reaction gas for forming the SiN$_x$ film layer may be a mixed gas of silane (SiH$_x$), ammonia (NH$_3$), and nitrogen (N$_2$), or a mixed gas of silicon dichloride (SiH$_2$Cl$_2$), ammonia (NH$_3$), and nitrogen (N$_2$). Wherein, the thickness of a deposited film layer is about 1000-3000 Å.

Figure 2:
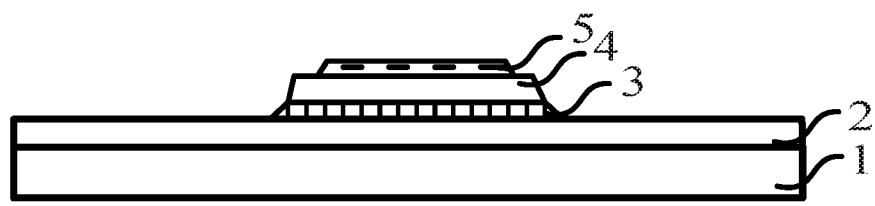
FIG. 2 is a schematic structural view of an embodiment of a LTPS substrate according to the present disclosure, mainly showing a cross-sectional morphology formed after etching of the LTPS substrate.

The polysilicon layer 5 is disposed above the second buffer layer 4. Specifically, the polysilicon layer 5 includes a polysilicon film layer formed by crystallizing a deposited amorphous silicon film layer (the amorphous silicon film layer referred to herein does not include a lanthanide element). For the formation of the film layer of the polysilicon layer 5, specifically, an amorphous silicon film layer (the film layer is not doped with a lanthanide element) is deposited on the light shielding layer 3 (corresponding to the case where there is no second buffer layer 4 on the LTPS substrate) or on the second buffer layer 4. The corresponding reaction gas may be a mixed gas of SiH$_4$ and hydrogen (H$_2$) or a mixed gas of silicon dichloride (SiH$_2$Cl$_2$) and hydrogen (H$_2$). After the amorphous silicon film layer is formed, the amorphous silicon film layer is subjected to a thermal annealing process to achieve the purpose of removing hydrogen in the amorphous silicon film layer, thereby preventing hydrogen explosion from occurring during the subsequent step of crystallization. After the crystallization process, the amorphous silicon film layer may further form the polysilicon layer 5. In some embodiments of the present disclosure, the polysilicon layer 5 may be used as a subsequent active layer (as shown in FIG. 2), and an orthographic projection of the active layer on the base substrate at least partially overlapping with an orthographic projection of the light shielding layer on the base substrate.

In this embodiment, the LTPS substrate provided includes a first buffer layer 2, a light shielding layer 3, a second buffer layer 4, and a polysilicon layer 5. In the case of this structure, in some embodiments of the present disclosure, the first buffer layer 2 is a stacked film layer formed of silicon oxide and silicon nitride. In some embodiments of the present disclosure, the second buffer layer 4 is a single layer of a silicon oxide (SiO$_x$) film layer.

In the present embodiment, using the amorphous silicon film layer doped with the lanthanide element as the light shielding layer 3 of the polysilicon layer 5 ensures the shielding efficiency to the light, satisfies the requirements of the LTPS, and reduces the cost.

Embodiment Two

In this embodiment, a fabricating method for a LTPS substrate is provided. Wherein, the LTPS substrate includes a base substrate 1, a first buffer layer 2, a light shielding layer 3, a second buffer layer 4, and a polysilicon layer 5 deposited on the base substrate 1 and sequentially stacked. Wherein, in some embodiments of the present disclosure, the film layer included in the LTPS substrate refers to the structural features provided by the embodiment one, which naturally inherits the advantages mentioned in the embodiment one.

Specifically, the fabricating method provided in this embodiment includes a process of performing cerium doping treatment on the light shielding layer 3 after the polysilicon layer 5 is deposited to form a film layer. The specific process of performing the doping treatment on the light shielding layer 3 includes adopting an ion implantation method (the implanter principle is that ions are accelerated and then have a certain kinetic energy, and enter the inside of the material by inertia, the main control parameters are Voltage and Beam Current which jointly control the kinetic energy of ions emitted, Scan Pass that controls the doping amount and Gas that controls the ion source; in this embodiment, it is necessary to control the Voltage and Beam Current to control the depth of doping of the cerium ions), to control the kinetic energy of the cerium ions, and allow the cerium ions to enter a position where the light shielding layer 3 is located and does not stay at a position where the polysilicon layer 5 is located. Further, the manner of controlling the kinetic energy of the cerium ions mainly includes a voltage being controlled to about 10-15 Kev and a beam current being controlled to about 0.9-1.3 μA/cm (i.e., about (1.0-1.2)±10% μA/cm). Furthermore, before the doping of cerium, the light shielding layer 3 is an amorphous silicon film layer, which requires a dehydrogenation process, that is, a thermal annealing process, and placing the LTPS substrate at an environment of a temperature of about 450-490° C. to be subjected to an air treatment for 3 about 0-60 min. It can be seen from the structure of the LTPS substrate that, since the light shielding layer 3 has a dielectric layer (buffer layer) thereon, the dehydrogenation effect of the light shielding layer 3 is not as good as that of the polysilicon layer 5 (when it is an amorphous silicon film layer) above the light shielding layer 3. When the polysilicon layer 5 (when it is an amorphous silicon film layer) is crystallized during the ELA process, the H contained in the bottom light shielding layer 3 may exude to cause a H explosion. In this embodiment, the cerium doping treatment is performed on the light shielding layer 3, so that the H which is not removed by the dehydrogenation process to the light shielding layer 3 during the ELA process can still be fixed by the reaction with cerium, thereby preventing the overflow of H which causes the H explosion. In some embodiments of the present disclosure, in the step including the cerium doping, the polysilicon layer 5 is ensured to meet the requirements of the general process during the dehydrogenation process (only less than about 2% of hydrogen is left).

Embodiment Three

Figure 3:
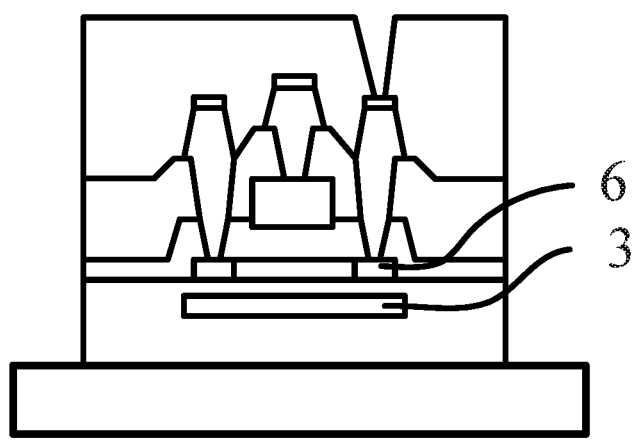
FIG. 3 is a schematic structural view of an embodiment of a thin film transistor according to the present disclosure, mainly showing a cross-sectional morphology of a TFT.

As shown in FIG. 3, in the present embodiment, a thin film transistor is provided. Specifically, the thin film transistor is fabricated on the basis of the LTPS substrate according to any one of the embodiment one. On the basis of the LTPS substrate, a cross-sectional morphology as shown in FIG. 2 can be formed by an etching process. At this time, the polysilicon layer is used as an active layer 6. In the subsequent process of the TFT, it is formed by conventional processes.

Further, in the present disclosure, another embodiment is further provided, which provides an array substrate including the thin film transistor according to any one of the embodiment three.

Furthermore, in the present disclosure, another embodiment is further provided, which provides a display device including the array substrate according to any one of the above embodiments. The display device includes a LTPS substrate and a thin film transistor disposed on the LTPS substrate. Since the electrical characteristics of the low temperature polysilicon thin film transistor used in the display device are relatively stable, the off-state current is effectively prevented, thereby improving the display quality of the display device.

Specifically, the display device refers to a device for obtaining information by a person through visual perception. Specifically, the display device naturally inherits all the advantages of the array substrate, and may be any product or component with display function, such as a display panel, an organic light emitting display (OLED) or a liquid crystal display (LCD), electronic paper, OLED panel, mobile phone, tablet, TV, display, laptop, digital photo frame, navigator, etc.

In summary, the present disclosure mainly employs an amorphous silicon film layer doped with the lanthanide element as the light shielding layer of the LTPS substrate, which not only ensures the light shielding efficiency but also reduces the production process, and further prevents the occurrence of the H explosion problem due to H exuding during the ELA process. Thus, the problem of ELA defects existing during the fabricating process of the LTPS substrate is solved, and in addition, the complexity of the overall fabrication of the corresponding device or system can be reduced to some extent and the cost can be effectively saved.

While some exemplary embodiments of the disclosure have been shown in the foregoing, a person skilled in the art should understand that, the embodiments of the disclosure may be changed without departing from the principle or spirit of the present disclosure. The scope of the present disclosure is defined by the claims and their equivalents.

What is claimed is:

1. A LTPS substrate for fabricating a thin film transistor, the LTPS substrate comprising a light shielding layer, the light shielding layer mainly composed of amorphous silicon doped with a lanthanide element.

2. The LTPS substrate according to claim 1, wherein the lanthanide element doped in the amorphous silicon is one of lanthanum and cerium.

3. The LTPS substrate according to claim 2, wherein a content of cerium in the light shielding layer is about 0.2-2.0% wt.

4. The LTPS substrate according to claim 2, wherein the LTPS substrate further comprises:
a first buffer layer disposed below the light shielding layer;
a second buffer layer disposed above the light shielding layer; and
a polysilicon layer disposed above the second buffer layer.

5. The LTPS substrate according to claim 4, wherein a deposition material of the first buffer layer and the second buffer layer comprises at least one of silicon oxide and silicon nitride, and wherein the polysilicon layer comprises a polysilicon film layer formed by crystallizing an amorphous silicon film layer as deposited.

6. A fabricating method of a LTPS substrate, wherein the LTPS substrate comprises a base substrate, a first buffer layer, a light shielding layer, a second buffer layer, and a polysilicon layer deposited on the base substrate and sequentially stacked, and wherein the fabricating method comprises performing a lanthanide element doping treatment on the light shielding layer after the polysilicon layer is deposited to form a film layer.

7. The fabricating method of a LTPS substrate according to claim 6, wherein a specific process of performing the lanthanide element doping treatment on the light shielding layer comprises employing ion implantation where kinetic energy of the lanthanide element ion is controlled such that the lanthanide element ion enters a position where the light shielding layer is located and does not stay at a position where the polysilicon layer is located, and wherein a manner of controlling the kinetic energy of the lanthanide element ion mainly comprises a voltage being-controlled to about 10-15 Key, and an electron beam current being controlled to about 0.9-1.3 µA/cm.

8. The fabricating method of a LTPS substrate according to claim 7, wherein before performing the lanthanide element doping treatment on the light shielding layer, the method further comprises dehydrogenating, and placing the LTPS substrate at an environment of a temperature of about 450-490° C. to be subjected to an air treatment for about 30-60 min.

9. A thin film transistor, wherein the thin film transistor is fabricated on the basis of the LTPS substrate according to claim 1.

10. An array substrate, wherein the array substrate has the thin film transistor according to claim 9 formed thereon.

11. A display device, wherein the display device comprises the array substrate according to claim 10.

12. The thin film transistor of claim 9, wherein a light shielding layer of the LTPS substrate is located between a base substrate of the LTPS substrate and an active layer of the thin film transistor, an orthographic projection of the active layer on the base substrate at least partially overlapping with an orthographic projection of the light shielding layer on the base substrate.

13. A thin film transistor, wherein the thin film transistor is fabricated using the LTPS substrate according to claim 2.

14. A thin film transistor, wherein the thin film transistor is fabricated using the LTPS substrate according to claim 3.

15. A thin film transistor, wherein the thin film transistor is fabricated using the LTPS substrate according to claim 4.

16. A thin film transistor, wherein the thin film transistor is fabricated using the LTPS substrate according to claim 5.

* * * * *

UNITED STATES PATENT AND TRADEMARK OFFICE
CERTIFICATE OF CORRECTION

PATENT NO. : 10,916,565 B2
APPLICATION NO. : 16/330922
DATED : February 9, 2021
INVENTOR(S) : Haixu Li et al.

Page 1 of 1

It is certified that error appears in the above-identified patent and that said Letters Patent is hereby corrected as shown below:

In the Claims

In Claim 7, Column 8, Line 17, delete "10-15 Key, and" and insert therefor -- 10-15 Kev, and --.

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*